United States Patent [19]

Takeno et al.

[11] Patent Number: 4,832,455
[45] Date of Patent: May 23, 1989

[54] LIQUID CRYSTAL APPARATUS HAVING AN ANISOTROPIC CONDUCTIVE LAYER BETWEEN THE LEAD ELECTRODES OF THE LIQUID CRYSTAL DEVICE AND THE CIRCUIT BOARD

[75] Inventors: Shozo Takeno, Yokohama; Masayuki Kakegawa, Hyogo; Yoshimasa Adachi, Yokohama, all of Japan

[73] Assignee: Kabushiki Kaisha Toshia, Kanagawa, Japan

[21] Appl. No.: 94,383

[22] Filed: Sep. 4, 1987

[30] Foreign Application Priority Data

Sep. 11, 1986 [JP] Japan .................................. 61-214859

[51] Int. Cl.⁴ .............................................. G02F 1/13
[52] U.S. Cl. .................................. 350/334; 350/336; 350/344
[58] Field of Search ........................ 350/336, 334, 344

[56] References Cited

U.S. PATENT DOCUMENTS

| 4,385,292 | 5/1983 | Nonomura et al. | 350/334 X |
| 4,679,043 | 7/1987 | Morokawa | 350/333 X |
| 4,721,365 | 1/1988 | Nishimura | 350/336 |
| 4,733,948 | 3/1988 | Kitahara | 350/339 F |

FOREIGN PATENT DOCUMENTS

| 0070528 | 6/1981 | Japan | 350/336 |
| 0209722 | 10/1985 | Japan | 350/334 |

OTHER PUBLICATIONS

Brody et al., "A 6×6 Inch, 20 Lines-Per-Inch Liquid-Crystal Panel, IEEE Trans. On Elec. Dev.", vol. Ed.-20, No. 11, Nov. 1973, pp. 995-1001.
Japanese Patent Disclosure, No. 58-56996, Yuzi Takei, Suwaseikosha, Dec. 17, 1983.
Japanese Patent Disclosure No. 59-40319, Katuyoshi Takemura et al., Sep. 29, 1984.

Primary Examiner—Stanley D. Miller
Assistant Examiner—Huy Kim Mai
Attorney, Agent, or Firm—Finnegan, Henderson, Farabow, Garrett & Dunner

[57] ABSTRACT

A liquid crystal apparatus in which an anisotropic conductive layer made of organic resin containing several electrically conductive particles having substantially identical particle sizes is disposed between lead electrodes of a liquid crystal device and the lead electrodes of a drive circuit board, thermocompression bonding being applied to make the electrically conductive particles in direct contact with both lead electrodes to allow both lead electrodes to be electrically connected with each other. Further, at least one of the lead electrodes of a common electrode in the liquid crystal device and of the circuit board corresponding to the common electrode includes a number of separated electrodes that are spaced apart, and the pitches and widths of the separated electrodes are in the range of ±30% around the average values for pitch and width for the separated electrodes.

4 Claims, 6 Drawing Sheets

LIQUID CRYSTAL APPARATUS HAVING AN ANISOTROPIC CONDUCTIVE LAYER BETWEEN THE LEAD ELECTRODES OF THE LIQUID CRYSTAL DEVICE AND THE CIRCUIT BOARD

The present application claims priority of Japanese patent application No. 61-214859 filed on Sept. 11, 1986 and No. 62-207577 filed on Aug. 21, 1987.

BACKGROUND OF THE INVENTION

The present invention relates to a liquid crystal apparatus used to display several kinds of characters, marks, images or the like, and more particularly to a highly reliable liquid crystal apparatus in which the lead electrodes in a liquid crystal device are securely connected to the lead electrodes of a drive circuit board with less resistance.

Recently, liquid crystal apparatus have been designed for television display, graphic display and the like. Therefore, it has become important to develop liquid crystal apparatus having a large capacity and a high density. Such liquid crystal apparatus have drive circuit boards which are connected to a liquid crystal device.

In the conventional liquid crystal apparatus, in order to connect a liquid crystal device with a drive circuit board, the following method is adopted. An electrically conductive rubber connector is disposed between each lead electrode of the liquid crystal device and the associated lead of the drive circuit board. Both are retained, as necessary, from the outside by a retaining mechanism, such as a spring member, to electrically connect both lead electrodes.

The electrically conductive rubber connector is formed of several conductive layers, each of which is made of an insulating material such as silicone rubber or the like contains electrical conductive powder such as carbon powder, metal powder or the like. Each conductive layer is formed so as to have a thickness which is less than the width of a lead electrode and also less than the width of a space between lead electrodes. This conductive layer is produced by using a silicone rubber in a normally liquid form containing electrical powder dispersed therein, which is disposed between magnets to collect the electrical conductive material around magnetic poles, and is hardened in this condition.

With the electrically conductive rubber connector, there is a problem when the electrical conductivity of the boundary between each adjacent conductive layer and insulator in the electrically conductive rubber connector gradually varies. This problem creates difficulty in thinning the connector and causes low accuracy. Therefore, it has been difficult to connect several lead electrodes with a high density.

Further, since retaining mechanisms are generally required, there has been difficulty in thinning and miniaturizing of the products.

In order to address these problems, there have been investigations of a method of connecting lead electrodes in which an anisotropic conductive layer, made of organic resin containing electrically conductive particles having substantially equal particle sizes, is disposed between the lead electrodes of a liquid crystal device and a drive circuit board. The layer is subjected to thermocompression bonding so that the electrically conductive particles between the lead electrodes of the liquid crystal device and the drive circuit board are in presscontact with both lead electrodes.

However, the lead electrodes of a common electrode for a liquid crystal device and the associated lead electrodes of the drive circuit board have a relatively wide width, such as, for example, about 2 mm in conventional liquid crystal apparatus. Wide widths are used so that the electrical resistance is reduced.

Unfortunately, with the above method, no relieving places for organic resin exist in the wide lead electrodes of the common electrode and the associated lead electrodes of the circuit board. Therefore, a large amount of organic resin exists between both electrodes, and the thickness of the anisotropic electrical conductive layer is unaltered. Accordingly, the contact of the electrically conductive particles to the lead electrodes is inferior, resulting in a large contact resistance. In the worst case, electrical connection between the electrodes cannot be obtained.

For example, in the case of an active matrix type liquid crystal apparatus in which electrical connection is made by the above mentioned method, an electrical resistance of about 0.2 to 0.5 $\Omega$/lead exists between the lead electrodes of the liquid crystal device other than the lead electrode and the associated lead electrodes of the circuit board, while an electrical resistance of about 1.0 to 1.5 $\Omega$/lead exists between the lead electrodes of the common electrode and the associated lead electrodes of the circuit board. Further, in a test of reliability, under an atmosphere in which the temperature is 80° C. and the humidity is 95% and a liquid crystal apparatus is left for 10 to 100 hours, the former resistance is changed to about 20 $\Omega$/lead, while the latter resistance is changed to about 200 $\Omega$/lead.

Further, as the testing time is made longer, the former resistance is slightly increased while the latter resistance is abruptly increased to a value in a range form several k$\Omega$ to several hundred k$\Omega$, and in the worst case, an open circuit is effected.

SUMMARY OF THE INVENTION

One object of the present invention is to provide a liquid crystal apparatus in which electrical connection between a liquid crystal device and a drive circuit with the use of an anisotropic electrical conductive layer can be uniformly made.

Another object of the present invention is to provide a liquid crystal apparatus in which electrical connection between a liquid crystal device and a drive circuit board with the use of an anisotropic electrical conductive layer can be made with a relatively low electrical resistance.

Still another object of the present invention is to provide a highly reliable liquid crystal apparatus.

The present invention provides a liquid crystal apparatus having a liquid crystal device in which liquid crystal is held between a substrate on which a common electrode is formed and a substrate on which a plurality of pixel electrodes are formed, and in which lead electrodes for applying voltage to the common electrode and the pixel electrodes being led from one of the substrates are formed. A circuit board is formed with lead electrodes, including a lead electrode electrically connected to the lead electrode of the common electrode. An anisotropic conductive layer is disposed between the lead electrodes of the liquid crystal device and those of the circuit board and is made of organic resin containing several electrically conductive particles having substantially equal particle sizes, wherein the electrically conductive particles are in direct contact with the lead electrodes to electrically connect the lead electrodes of the liquid crystal device and of the circuit board with each other. The lead electrode of the common electrode and/or the lead electrode of the circuit board electrically connected to the lead electrode of the common electrode includes a number of separated electrodes that are spaced apart to form a gap between adjacent separated electrodes to provide a relieving place for the organic resin. The separated lead electrodes together have an average value for pitch and width, and each of the separated electrodes has an individual pitch and width within the range of ±30% around the average values for pitch and width.

DETAILED DESCRIPTION OF PREFERRED EMBODIMENTS

The embodiments of the present invention will be explained with reference to the drawings.

Figure 1:
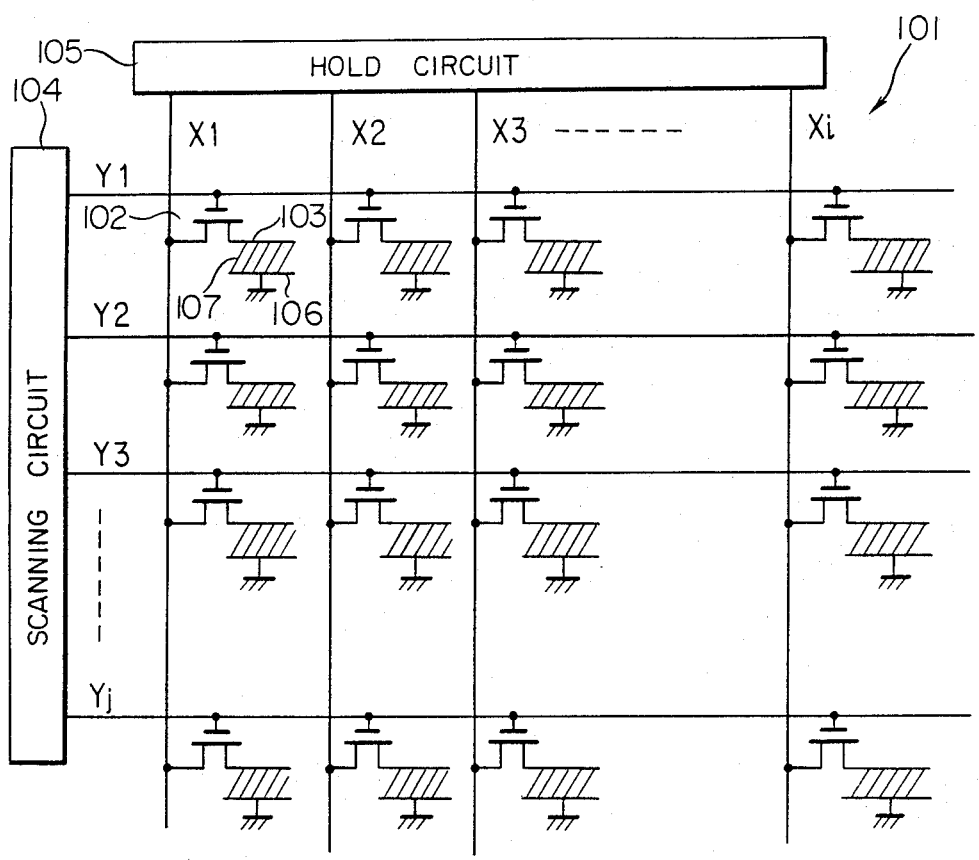
FIG. 1 is a schematic view illustrating a circuit in an active matrix type liquid crystal apparatus.

FIG. 1 shows a circuit diagram for an active matrix type liquid crystal apparatus. Several data lines $X_i$ (i=1, 2, 3 ... n) and several gate lines $Y_j$ (j=1, 2, 3 ... n) substantially orthgonal to the former are formed in the array substrate 101. A TFT (thin film transistor) 102 is formed at each of the positions of crossing points between the data lines $X_i$ and the gate lines $Y_j$. Further, drain electrodes of the TFTs 102 are connected to the data lines for each column, and gate electrodes are connected to the gate lines $Y_j$ for each row.

A transparent pixel electrode 103 is formed in each of matrix-like areas defined by the data lines $X_1$ and the gate lines $Y_j$, and is connected to a source electrode of each TFT 102.

The gate lines $Y_j$ correspond to scanning lines and are connected to a scanning circuit 104. Further, the data lines $X_i$ are connected to a hold circuit 105 for feeding display signals in one horizontal line unit.

Further, a common electrode 106 is arranged opposing the transparent pixel electrodes 103, and liquid crystal 107 is sandwiched between the common electrode 106 and the transparent electrodes 103.

Figure 2:
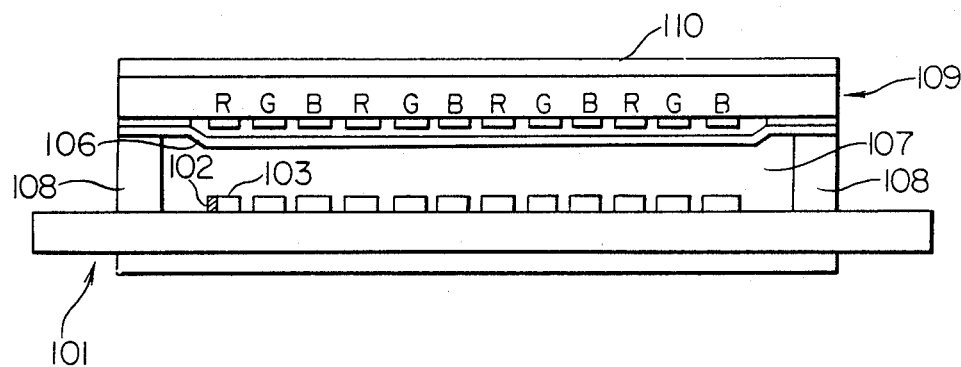
FIG. 2 is a schematic cross-sectional view illustrating an active matrix type liquid crystal apparatus.

As shown in FIG. 2, the common electrode 106 is formed on a transparent substrate 109 which is opposed to the array substrate 101 and held by a spacer 108. Further, the transparent substrate 109 is also formed therein with filters for red (R), green (G), and blue (B) colors, corresponding to the transparent pixel electrodes 103, and a polarizing plate 110 is set on the outer surface of the transparent substrate 109 and the array substrate 101.

In the liquid crystal device having the above-mentioned arrangement, when a voltage is applied to, for example, the gate line ($Y_1$) while high level data is fed to the data line $X_1$, the TFT 102 at the crossing point between the gate line $Y_1$ and the gate line $X_1$ is energized so that a voltage is accumulated between the transparent pixel electrode 103 at this position and the common electrode 106, resulting in the liquid crystal 107 being oriented. Therefore, light can pass through this part when the transmission axes of two polarizing plates 110 are about parallel each other. Thus, pixels through which light is transmitted are selected in accordance with signals from the data lines $X_i$ so that it is possible to display an image. The gate lines $Y_j$ are scanned at a predetermined frequency, and therefore, accumulated voltages at pixel electrodes are rewritten at this frequency.

Figure 3:
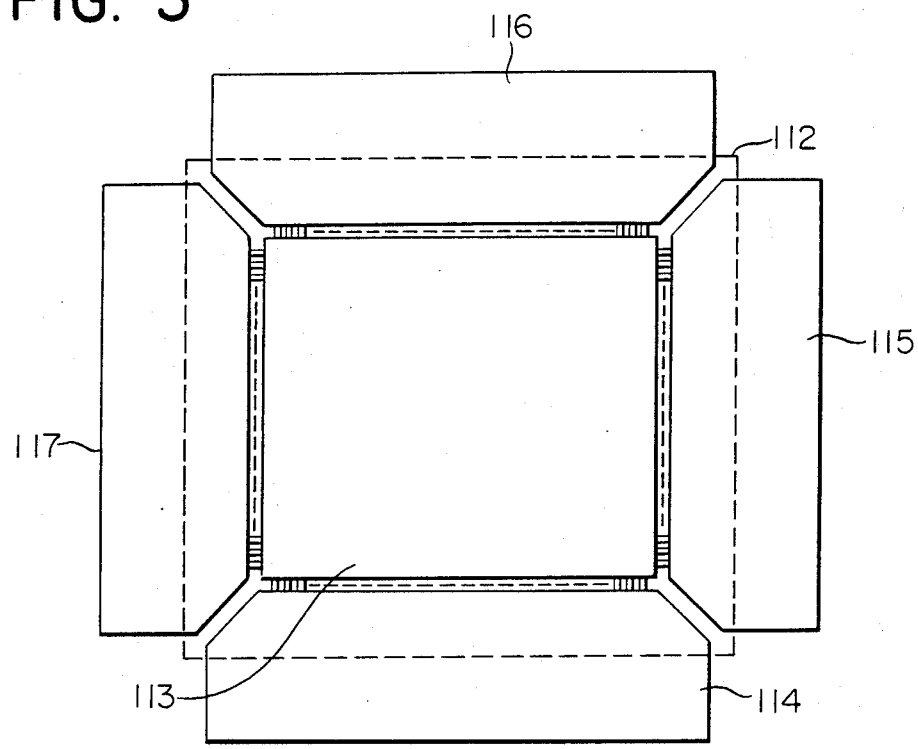
FIG. 3 is a schematic plan view illustrating a liquid crystal apparatus in one embodiment of the present invention.
Figure 4:
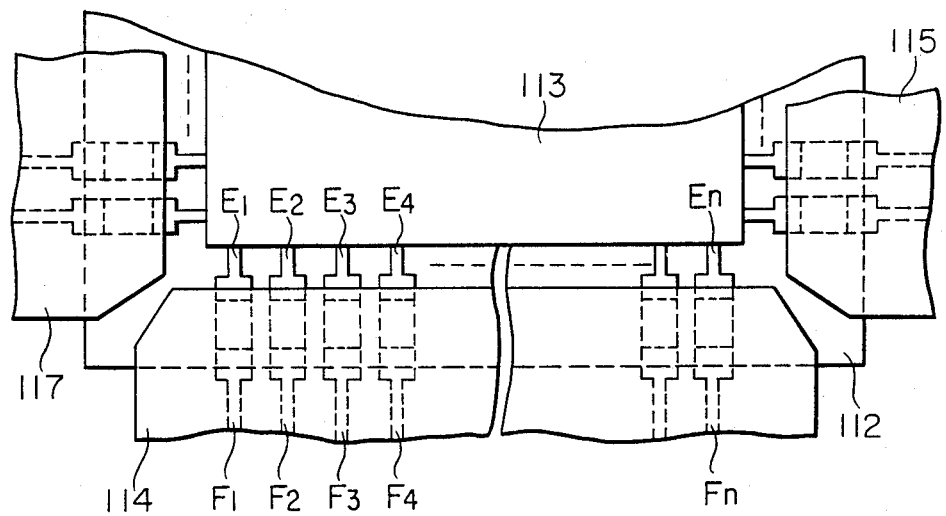
FIG. 4 is an enlarged schematic plan view illustrating a part of FIG. 3.

FIG. 3 shows the external view of the active matrix type liquid crystal apparatus. As explained above, the center area of a liquid crystal device 112 composed of the array substrate 101, transparent substrate 109, and the liquid crystal 107 sandwiched therebetween serves as liquid crystal display section 113. Further, as shown in FIG. 4, lead electrodes Ei for applying voltage to the transparent pixel electrodes 103 to the common electrode 106 are provided along the four sides of one of the substrates, for example, the array substrate 101.

Further, the lead electrode of the common electrode 106 includes a number of separated electrodes that are spaced so that they have pitches and width substantially identical to those of the lead electrodes for the transparent pixel electrodes 103. In this arrangement, for example, the separated electrodes $E_1$ to $E_7$ are allocated for the lead electrode of the common electrode 106, and the lead electrodes $E_8$ to $E_n$ are allocated for the transparent pixel electrodes 103.

Further, circuit boards 114, 115, 116 and 117, each composed of a flexible printed circuit (FPC) mounted thereof with a driver IC chip (not shown), are arranged along the sides of the liquid crystal device 112, having lead electrodes $F_j$ (j=1, 2, 3 ... n) corresponding to the lead electrodes of the liquid crystal device 112.

The lead electrodes $F_j$ of these circuit board 114, 115, 116 and 117 are connected to the lead electrodes $E_1$ of the liquid crystal device 112, as explained below.

Figure 5:
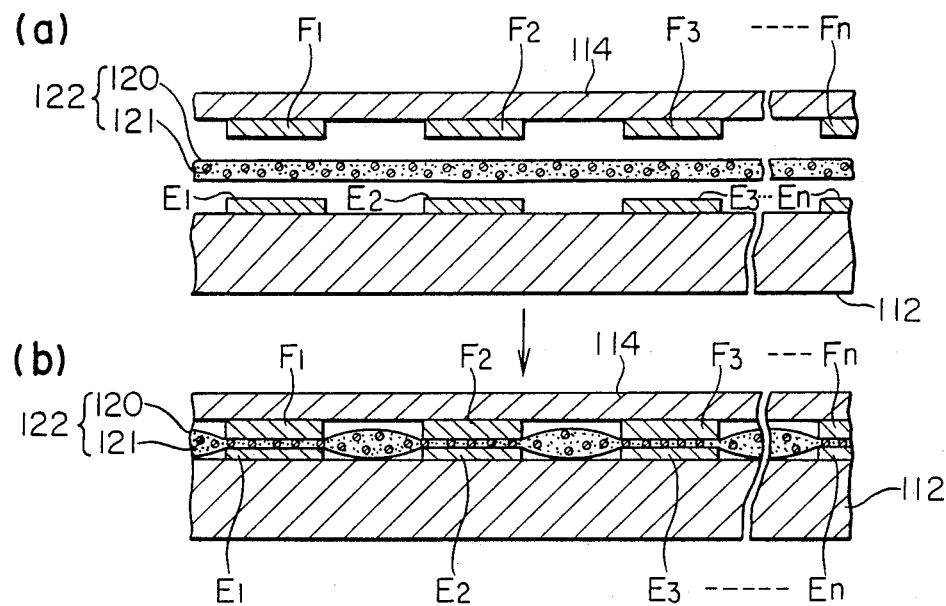
FIGS. 5a and 5b are schematic cross-sectional views illustrating the liquid crystal apparatus in one embodiment of the present invention, FIG. 5a showing before thermocompression bonding and FIG. 5b showing after thermocompression bonding.

As shown in FIG. 5a, on the array substrate made of a glass substrate having a thickness of about 1.0 mm, aluminum lead electrodes having a width of 50 to 250 μm, for example, 165 μm, and a thickness of about 1 μm are formed at pitches of 150 to 500 μm for example, (330 μm). Further, on a film such as polyimide film or the like, having a thickness of about 25 μm, flexible tape lead electrodes $F_j$ made of Cu+Ni+Au, having a width of 165 μm, and a thickness of 10 to 500 μm, for example, 18 μm are formed at pitches of 330 μm. It is noted that the separated electrodes $E_1$ to $E_7$ are allocated for the lead electrode of the common electrode 106 and the lead electrodes $E_8$ to $E_n$ are allocated for the transparent pixel electrodes 103 in the liquid crystal device 112, and have substantially identical pitches and widths.

Further, an anisotropic conductive layer 122 having a thickness of 10 to 30 μm for example, (25 μm), and made of a thermoplastic resin binder 120 in which electrically conductive particles 121 (such as Ni particles coated with a film made of Ni alloy or Au, and having a particle size of 1 to 10 μm, for example, about 2 μm) are dispersed, is disposed between the lead electrodes $E_i$, $E_j$. A film having a commercial name "Anisolm" is available from Hitachi Chemical Industrial Co. and can be used as such an anisotropic conductive layer 122.

Then, they are heated and pressed under a temperature of 150° C. and a pressure of 30 kg/cm² for 20 sec., and the anisotropic conductive layer 122 is depressed so as to connect lead electrodes Ei with lead electrodes Fj, as shown in FIG. 5b.

With the liquid crystal apparatus in this embodiment, the interelectrode resistance was measured as having a low value such as 0.2 to 0.5 Ω/lead over 240 leads, and a uniform result was obtained. In this case, the concentration of the electrically conductive particles per lead was about 10 to 20 particles.

Figure 6:
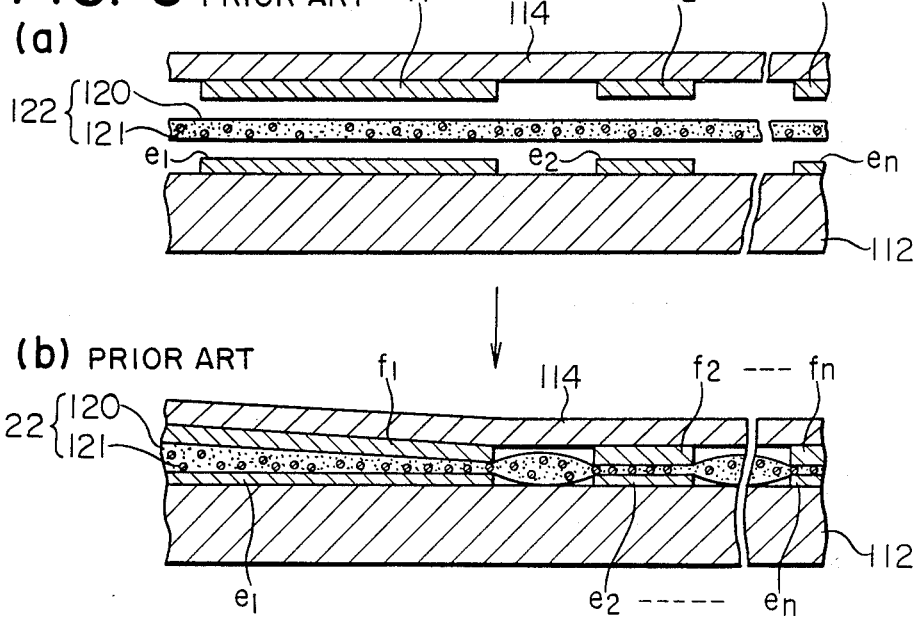
FIGS. 6a and 6b are schematic cross-sectional views illustrating a conventional liquid crystal apparatus in which anisotropic conductive layers are used, FIG. 6a showing before thermocompression bonding and FIG. 6b showing after thermocompression bonding.

FIGS. 6a and 6b show a conventional liquid crystal apparatus using an anisotropic conductive layer 122.

In such a conventional liquid crystal device, the lead electrode $e_1$ of the common electrode and the associated lead electrode $f_1$ of the circuit board electrically connected to the common electrode lead are wide. Accordingly, organic resin between electrodes $e_1$ and $f_1$ has no relieving place and therefore, the anisotropic conductive layer 122 has a large thickness with a large amount of organic resin between the lead electrodes $e_1$, $f_1$. The contact of the electrically conductive particles 121 so the lead electrodes is insufficient, resulting in increased contact resistance, and in the worst case, no electrical connection exists.

In the liquid crystal apparatus according to the present invention, the lead electrode of the common electrode in the liquid crystal device 112 and the lead electrode of the circuit board electrically connected to the lead electrode of the common electrode, include a number of separated electrodes are spaced apart. Accordingly, when the anisotropic conductive layer 122 is disposed between the separated electrodes and is subjected to thermocompression bonding, as shown in FIG. 5b, the anisotropic conductive layer 122 is depressed by the separated electrodes $E_1$ $E_7$ $F_1$ $F_7$ and therefore thinned. Organic resin 120 is pushed out through the gaps between adjacent separated electrodes so that the electrically conductive particles 121 are held between the electrodes in the vertical direction to ensure electrical connection. Accordingly, since pressure is uniformly applied to the film during thermocompression bonding, and since relieving places for organic resin 120 can be formed, the thickness of the anisotropic conductive layer 122 is made uniform over the common electrode section in its entirety, and therefore the contact resistance is low and uniform.

Figure 7:
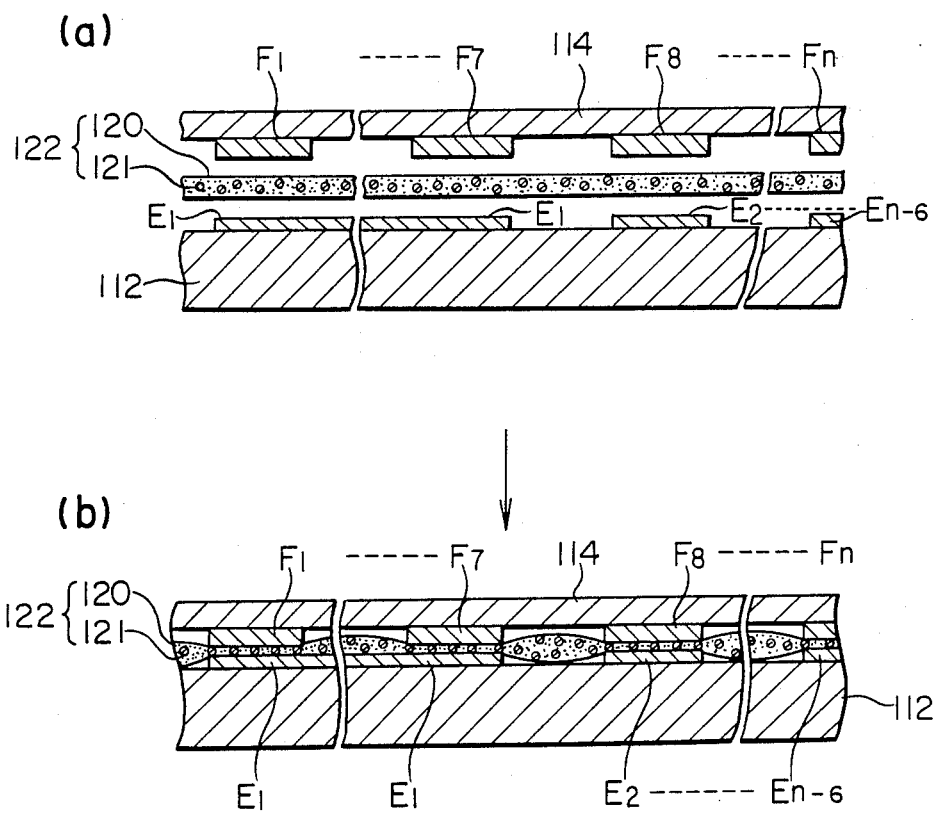
FIGS. 7a and 7b are schematic cross-sectional views illustrating a liquid crystal apparatus in another embodiment of the present invention, FIG. 7a showing before thermocompression bonding and FIG. 7b showing after thermocompression bonding.

FIGS. 7a and 7b show a liquid crystal apparatus in another embodiment, in which the identical reference numerals are given to those of FIGS. 5a and 5b.

In this embodiment, the lead electrode $E_1$ of the common electrode in the liquid crystal device 112 has a width of about 2 mm, and there are provided several separated electrodes, for example, seven electrodes $F_1$ to $F_7$—electrically connected to the above-mentioned single electrode $E_1$. The separated electrodes each have pitch and width substantially equal to those of the lead electrodes $F_n$ of the circuit board. In such a liquid crystal apparatus, technical effects and advantages similar to those obtained by the liquid crystal apparatus in the aforementioned embodiment are obtained.

Errors occur during the production of liquid crystal apparatus even though the pitches and widths of the lead electrodes are made to be identical. Further, the spacing of the separated electrodes of the common electrode or of the circuit board electrically connected to the lead electrode of the common electrode need not always be such that they have identical pitches and widths to the other separated electrodes. However, in order to provide uniformity, the separated electrodes preferably have pitches and widths in a range of ±30% around an average value.

Figure 8:
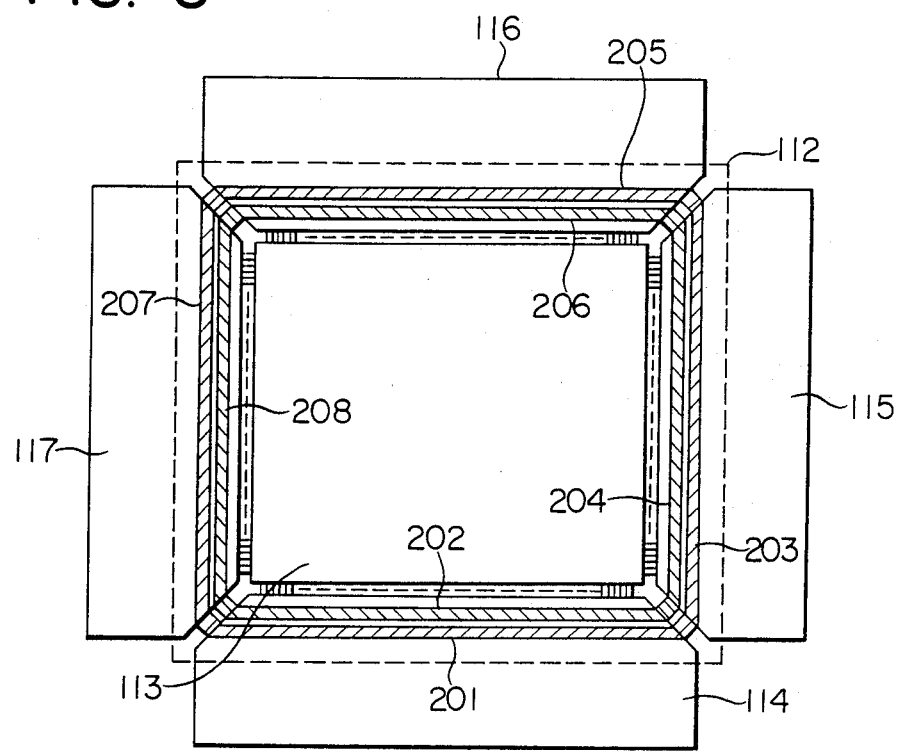
FIG. 8 is a schematic plan view illustrating a liquid crystal apparatus in another embodiment of the present invention.
Figure 9:
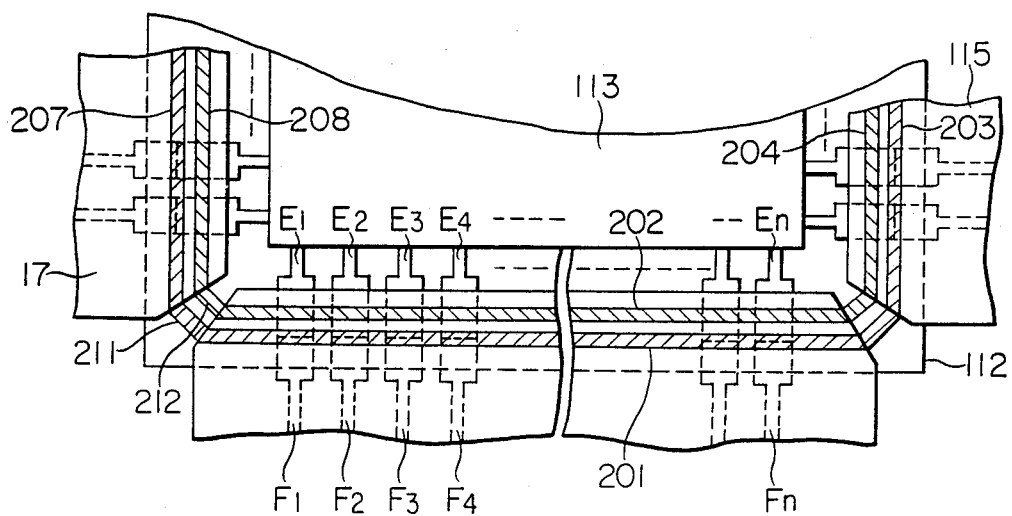
FIG. 9 is an enlarged schematic plan view illustrating a part of FIG. 8.
Figure 10:
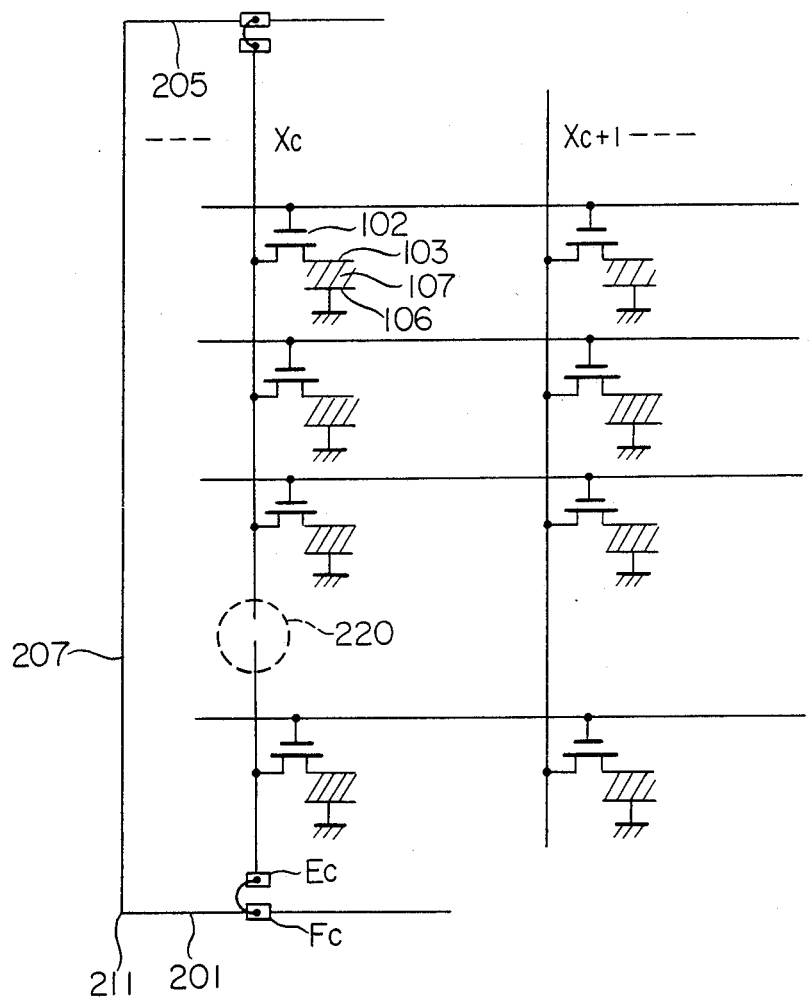
FIG. 10 is a schematic view illustrating a circuit in the liquid crystal apparatus of FIG. 8, showing a repairing condition when wire breakage occurs.

FIGS. 8 and 9 show a liquid crystal device in another embodiment of the present invention, in which identical reference numerals are given to those in the liquid crystal device of FIGS. 3 and 4.

In this liquid crystal device, a series of pattern wirings 201 and 202 are formed on the rear side of the lead electrodes $F_j$ of the drive circuit 114, along the direction in which the lead electrodes $F_j$ are arranged. The number of the pattern wirings is two in this case, but the number of pattern wirings is not limited to this number.

Further, pattern wirings 203 to 208 are formed similarly on the rear side of the lead electrodes of the drive circuit boards 115, 116 and 117.

Accordingly, the above-mentioned pattern wirings 201 to 208 serve to reinforce the output electrode sections of the flexible drive circuit boards 114 to 117 toward the lead electrode pitch direction. Even if the drive circuit boards 114 to 117 tend to expand and contract due to variations in temperature, humidity or the like, the tendency is restrained by the pattern wirings 201 to 208. As a result, when the output electrodes $F_j$ of the drive circuit boards 115, 116 and 117 are connected to the substrate electrodes Ei of the array substrate 101, and are opposed to each other, no pitch deviation occurs therebetween, and it is possible to ensure satisfactory and accurate connection.

In order to connect pattern wirings on adjacent circuit boards, connecting patterns 211 and 212 are previously formed on, for example, the array substrate 101 as shown in FIG. 9, and connection is made with the use of a soldering process. Accordingly, a loop is formed by, for example, the pattern wirings 201, 203, 205 and 207. If any wire breakage occurs in, for example, a wire breakage part 220 of the data line $X_c$, the electrode $F_c$ or $E_c$ is connected to the pattern wiring 201, and the part is connected to the electrode on the side opposite to the data line $X_c$ through the intermediary of this pattern wiring. Thus, even though the wire breakage part exists, data can be indirectly fed to a TFT 102 by way of the pattern wiring. Therefore, the TFTs to be fed with data can operate in a normal way.

What is claimed is:
1. A liquid crystal apparatus, comprising;
a liquid crystal device in which liquid crystal material is held between a substrate on which a common electrode is formed and a substrate on which a plurality of pixel electrodes are formed, and in which lead electrodes for applying voltage to said common electrode and to said pixel electrodes being led from one of said substrates are formed;

a circuit board formed with lead electrodes, including a lead electrode electrically connected to the lead electrode of the common electrode;

an anisotropic conductive layer disposed between the lead electrodes of said liquid crystal device and of said circuit board, and made of organic resin containing several electrically conductive particles having substantially equal particle sizes, wherein said electrically conductive particles are in direct contact with the lead electrodes to electrically connect the lead electrodes of the liquid crystal device and of the circuit board with each other;

said apparatus characterized in that at least one of the lead electrode of said common electrode and the lead electrode of said circuit board electrically connected to the lead electrode of said common electrode includes a plurality of separated electrodes that are spaced apart to form a gap between adjacent separated electrodes to provide a relieving place for the organic resin, and the pitch and width of each separated electrode is within the range of ±30% of the average values for pitch and width for the plurality of separated electrodes.

2. The liquid crystal apparatus according to claim 1, wherein the pitch and width of each of the separated electrodes are substantially identical with the pitches and widths of each of the other separated electrodes.

3. The liquid crystal apparatus according to claim 1, wherein said liquid crystal device is an active matrix type liquid crystal device having semiconductor elements on each of said pixel electrodes.

4. The liquid crystal apparatus according to claim 1, and further comprising a series of pattern wirings provided on a rear side of a lead electrode forming surface of said circuit board along the direction in which the lead electrodes are arrayed.

* * * * *